United States Patent [19]

Bran

[11] Patent Number: 5,365,960
[45] Date of Patent: Nov. 22, 1994

[54] MEGASONIC TRANSDUCER ASSEMBLY
[75] Inventor: Mario E. Bran, Garden Grove, Calif.
[73] Assignee: Verteq, Inc., Santa Ana, Calif.
[21] Appl. No.: 42,889
[22] Filed: Apr. 5, 1993
[51] Int. Cl.$^5$ .................................................. B08B 3/10
[52] U.S. Cl. ..................... 134/184; 134/902; 310/340; 310/346; 29/25.35
[58] Field of Search ............... 134/184, 902; 366/355; 310/340, 341, 346; 29/25.35

[56] References Cited

U.S. PATENT DOCUMENTS

| | | |
|---|---|---|
| 2,498,737 | 2/1950 | Holden . |
| 2,934,661 | 4/1960 | Chambers . |
| 3,596,883 | 8/1971 | Breech . |
| 3,700,937 | 10/1972 | Rissolo ................... 310/341 |
| 3,972,018 | 7/1976 | Erickson . |
| 4,183,011 | 1/1980 | Massa .................... 134/184 |
| 4,543,130 | 9/1985 | Shwartzman . |
| 4,804,007 | 2/1989 | Bran . |
| 4,823,041 | 4/1989 | Inoue et al. . |
| 4,869,278 | 9/1989 | Bran . |
| 4,998,549 | 3/1991 | Bran . |
| 5,037,481 | 8/1991 | Bran . |
| 5,090,432 | 2/1992 | Bran . |
| 5,247,954 | 9/1993 | Grant et al. ........... 134/184 |

*Primary Examiner*—Frankie L. Stinson
*Attorney, Agent, or Firm*—Knobbe, Martens, Olson & Bear

[57] ABSTRACT

A thin-walled rigid tube made of aluminum or other strong material that is a good thermal conductor and a good transmitter of megasonic energy is provided with an external sheath of Teflon to shield the tube from fluids used in cleaning semiconductor wafers. Arcuate transducers are coupled to the interior of the tube and energized with megasonic energy to transmit energy through the tube into fluid surrounding the wafers. A partition in the tube divides the tube into two or more chambers. Nitrogen is conducted through a tube end cap and through the chamber containing the transducers. Cooling water is ducted through the other chamber to conduct heat away from the assembly.

23 Claims, 7 Drawing Sheets

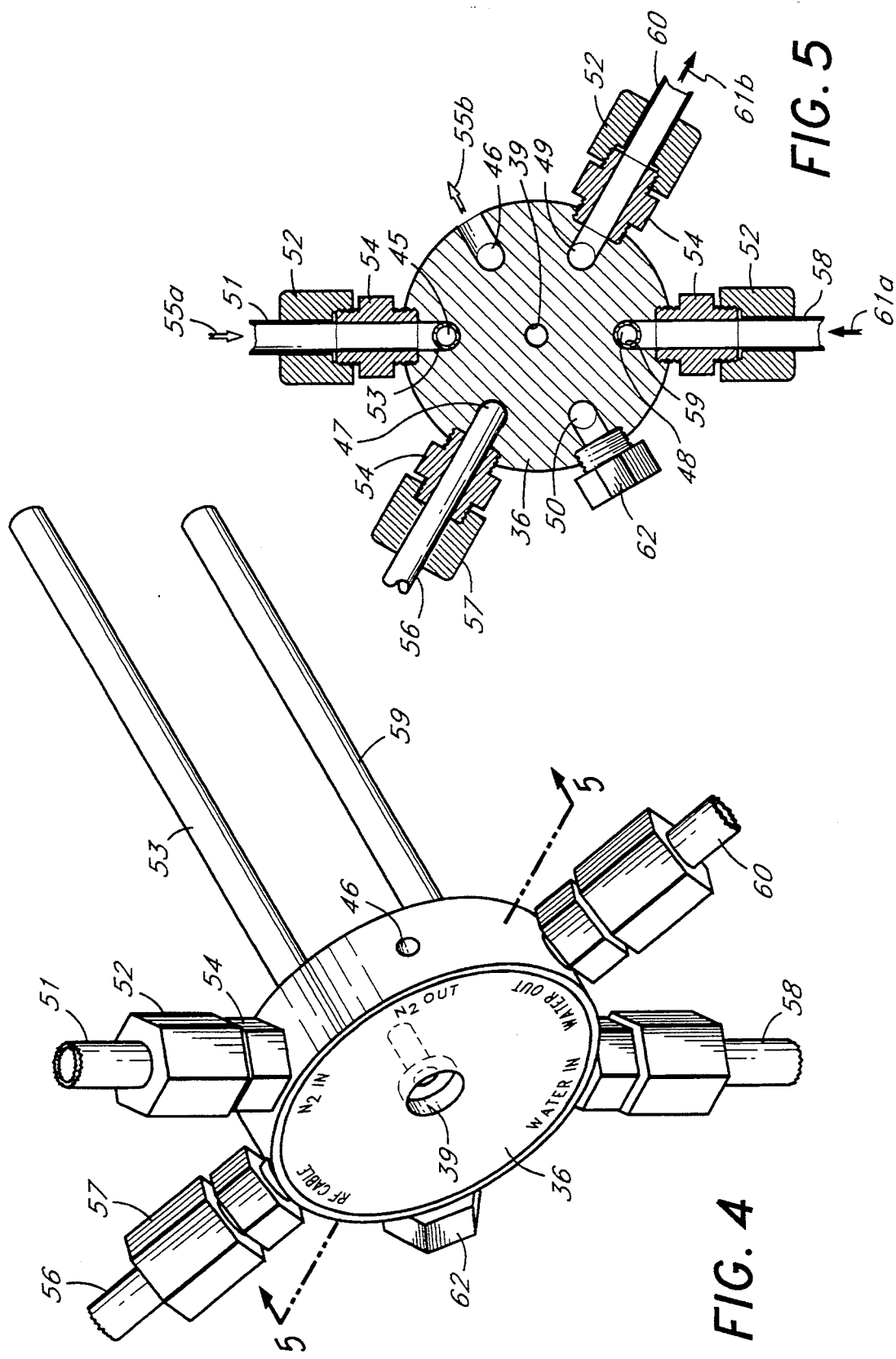

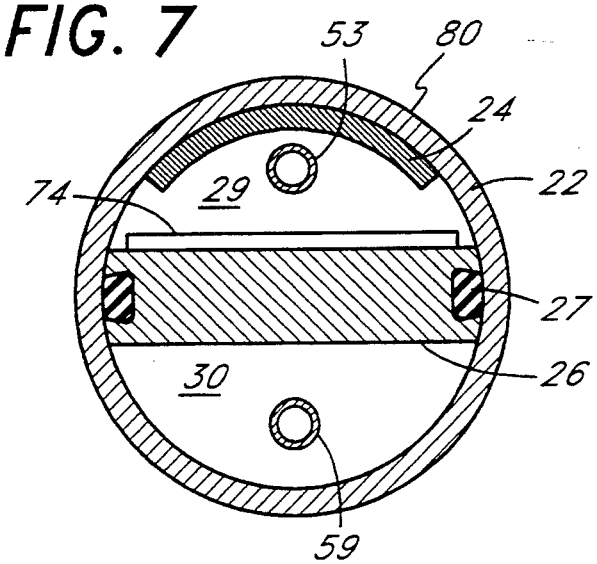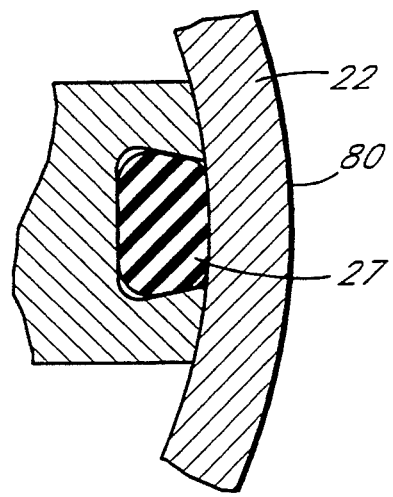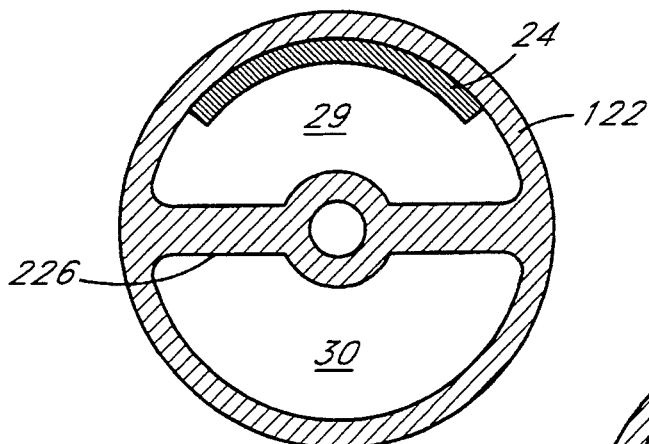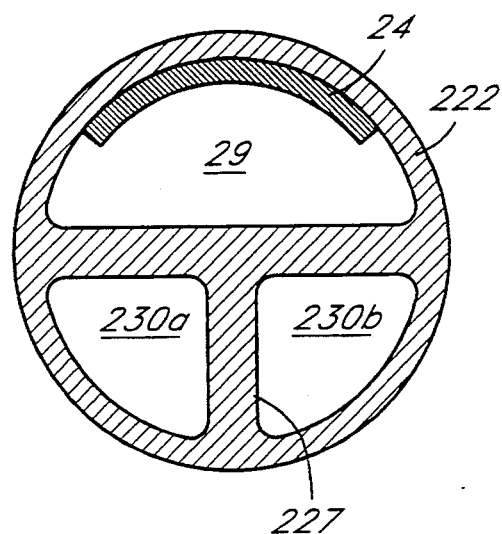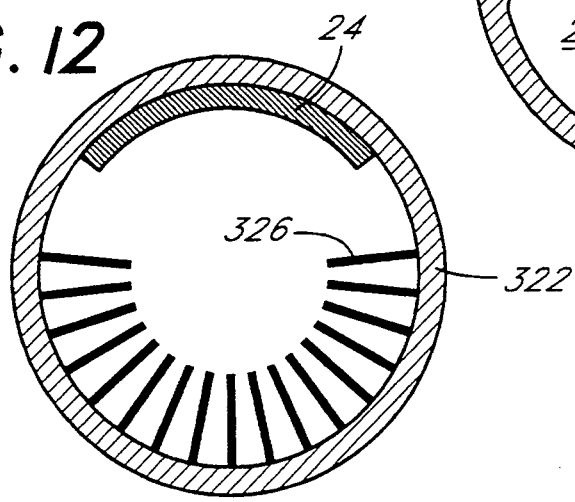

MEGASONIC TRANSDUCER ASSEMBLY

FIELD OF THE INVENTION

This invention relates to an apparatus for cleaning semiconductor wafers or similar items requiring an extremely high level of cleanliness. More particularly, the invention relates to an improved transducer assembly for such apparatus.

BACKGROUND OF THE INVENTION

As is well-known, the presence of particles on the surfaces of semiconductor wafers adversely affects the number of acceptable semiconductor devices that can be made from a particular wafer. More stringent requirements for the reduction of particle contamination are continuously being established. The use of megasonic energy to agitate the cleaning fluids employed have helped greatly in particle reduction. Examples of such arrangements are shown in U.S. Pat. Nos. 4,804,007, 4,869,278, 4,998,549 and 5,037,481. U.S. Pat. No. 5,037,481 discloses a transducer assembly wherein a transducer in the form of a thin arcuate segment is coupled to the interior of a quartz tube. Megasonic energy applied to the transducer is transmitted through the quartz tube in a diverging pattern so as to expose both sides of a plurality of wafers positioned in the cleaning fluid in the path of the megasonic energy. In one arrangement, the ends of the quartz tube extend beyond the walls of the container for the wafers and the cleaning fluid such that the electrical connections to the transducer can be easily made through the ends of the tube. In another arrangement, the ends of the tube are closed so that the assembly may be immersed in the fluid.

While the quartz tube assembly provides good cleaning results, there are some shortcomings of the arrangement. Quartz is a desirable material from the standpoint of minimizing contaminants and being compatible with most cleaning solutions, but quartz is incompatible with hydrofluoric acid used as an etching material. Also, while quartz is very hard and hence is a good transmitter of megasonic energy, it is somewhat brittle so that care must be taken in handling and use of quartz tubes so as to minimize the risk of breakage. If a quartz tube should crack, a flammable cleaning fluid could possibly enter the tube and be ignited by an electrical line within the quartz tube. For this reason, the quartz tube array is not recommended for use with flammable fluids.

Applying significant wattage to a megasonic transducer generates considerable heat, and it is desirable that some cleaning solutions be hot. However, the temperature of the transducer must be kept below a predetermined maximum in order to prevent damaging the transducers. With the quartz tube, transducer, coolant, usually in the form of water, is sprayed onto the transducer, or cool nitrogen may be utilized. However, a significant quantity of sprayed coolant is required to enable the transducer to be energized by the desired wattage, and nitrogen gas is a less effective coolant. The transducer electrical connections in a quartz transducer array can be encapsulated so that the tube can be filled with liquid coolant, but megasonic energy could be transmitted into the coolant and wasted. Coolant in gas or spray form does not transmit the energy to a significant degree.

Accordingly, a need exists for a transducer assembly that provides improvements or advantages over an assembly employing a quartz tube.

SUMMARY OF THE INVENTION

Briefly stated, the improved transducer assembly of the invention employs a transmitter tube made of metal or other strong rigid material which is a good transmitter of megasonic energy. The exterior portions of the tube which are to be exposed to cleaning and rinsing fluids, including hydrofluoric acid, are provided with a thin layer of material which can withstand the acid. In a preferred form of the invention, the layer is formed by a thin-walled sheath made of a suitable plastic, such as polytetrafluoroethylene, such as that sold under the trademark Teflon, which is heat-shrunk onto the exterior of the rigid tube. In addition, it is desirable to utilize an appropriate epoxy between the exterior of the metal tube and a roughened or etched interior of the plastic sheath. The epoxy provides a strong bond between the plastic and the metal tube which is not adversely affected by the vibration produced by the megasonic energy. The layer of plastic should be very thin such that it does not adversely affect the capability of transmitting the megasonic energy to any significant degree. Further, polytetrafluoroethylene is a desirable material from the standpoint of not being very reactive and hence the risk of contamination is minimized.

The assembly of the invention further includes an elongated partition within the tube which, with the tube walls, creates two or more long chambers. A transducer is coupled or bonded to the interior of the tube and is located in one of the chambers. The ends of the tube are closed, but an inlet and outlet for the transducer chamber enables nitrogen or some other desirable inert gas to be maintained in the transducer chamber under a slight pressure to prevent the passage of cleaning solution or other fumes into that chamber where they might come into contact with and damage the transducer electrical connections or the metal tube.

Liquid coolant, such as water, is ducted through the other chamber to cool the transducer assembly, so that the temperature is kept below that which would adversely affect the transducer or the bonding material. By selecting the transducer tube made of aluminum or other good thermal conductor, significant quantities of heat may be easily conducted away by the coolant. This keeps the temperature of the transducer, and the material bonding it to the tube, below a predetermined maximum. This in turn means that the wattage applied to the transducer can be increased, and the temperature controlled by increasing the flow of coolant. Increasing the wattage increases the agitation of the fluid caused by the megasonic energy and this in turn increases the speed of the cleaning operation. Also, by utilizing aluminum or other such material, the tube may be fabricated with very close tolerances so that it mates accurately with the arcuate transducers. This increases the effectiveness of the applied wattage and thereby provides higher production yields.

The partition in the tube creating the chambers may be a separate element having its ends in a sealed relation with the interior of the tube. Or, the tube may be extruded and the partition formed as part of the extrusion operation. Also, while a single partition is a desirable arrangement, forming additional partition walls will increase the heat transfer capability of the tube. Related to that, a tube with a large number of inwardly extending fins could be employed such that the assembly could possibly be adequately cooled using nitrogen as the coolant. In that arrangement, separate chambers would not have to be formed in that the transducer can remain in contact with the nitrogen, but a partition forming chambers is one more wall for assisting heat exchange.

Another advantage of utilizing a tube made of aluminum or other such material is that the tube may be electrically grounded so that RF energy is not escaping into the surrounding atmosphere which might interfere with proper functioning of adjacent equipment. Also, the partitioned tube may be used in any orientation, including being positioned above the wafers.

BRIEF DESCRIPTION OF THE DRAWINGS

FIG. 4 is an enlarged perspective view of an end portion of the transducer assembly illustrating fluid flow through the end cap into the transducer tube;

FIG. 5 is a cross-sectional view on line 5—5 of FIG. 4 further illustrating the fluid flow;

FIG. 7 is a cross-sectional view on line 7—7 of FIG. 2.

FIG. 8 is an enlarged fragmentary, cross-sectional view illustrating the partition seal more clearly;

FIG. 10 is a cross-sectional view of an alternative form of a tube for the transducer assembly;

FIG. 11 is a cross-sectional view of another embodiment of a tube for the transducer assembly;

FIG. 12 is a cross-sectional view of yet another embodiment of a tube for the transducer assembly;

DETAILED DESCRIPTION OF THE PREFERRED EMBODIMENT

Figure 1:
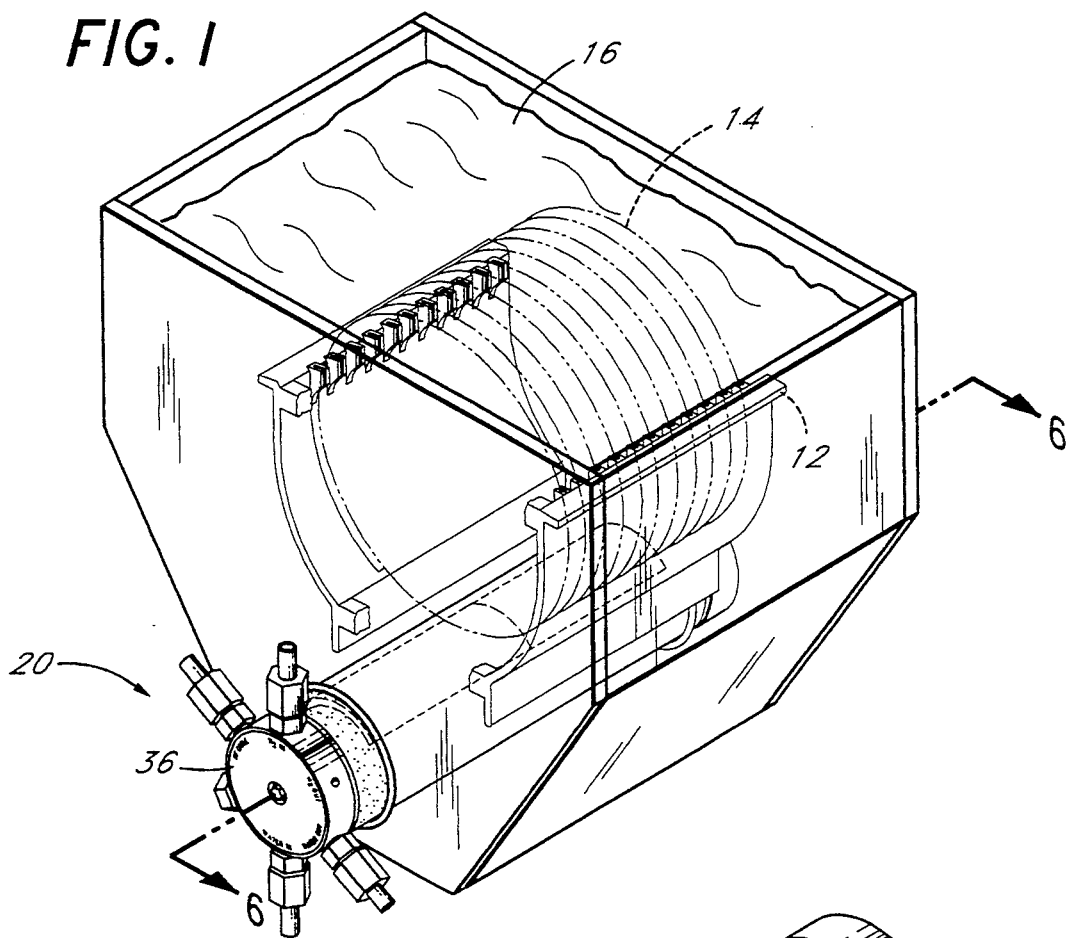
FIG. 1 is a perspective view of the transducer assembly of the invention, positioned with a schematically illustrated cleaning tank and cassette of semiconductor wafers.

Referring to FIG. 1, there is schematically illustrated a tank 10 containing a cassette 12 (partially cut away) of semiconductor wafers 14 immersed in cleaning solution 16. The wafers are supported and spaced in parallel, substantially vertical relation by the cassette. Instead of utilizing a cassette, the wafers may be supported directly in the tank by suitable supporting rods (not shown). In either event, the wafers are to be supported with minimum support contact and maximum exposure to megasonic energy emanating from below.

Figure 2:
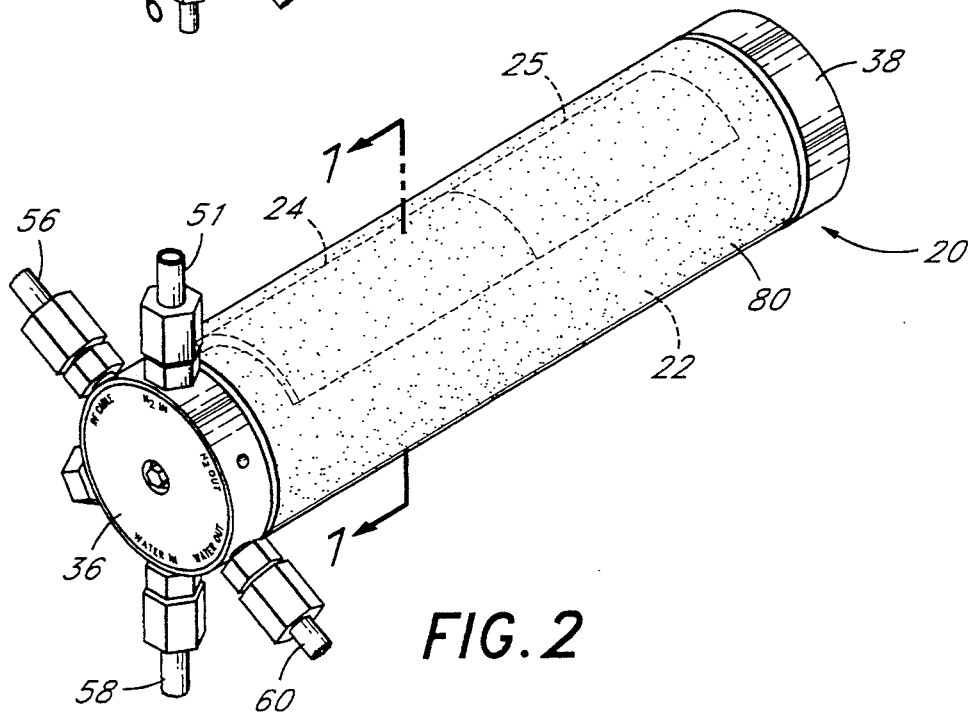
FIG. 2 is a perspective view of the transducer assembly of FIG. 1.
Figure 3:
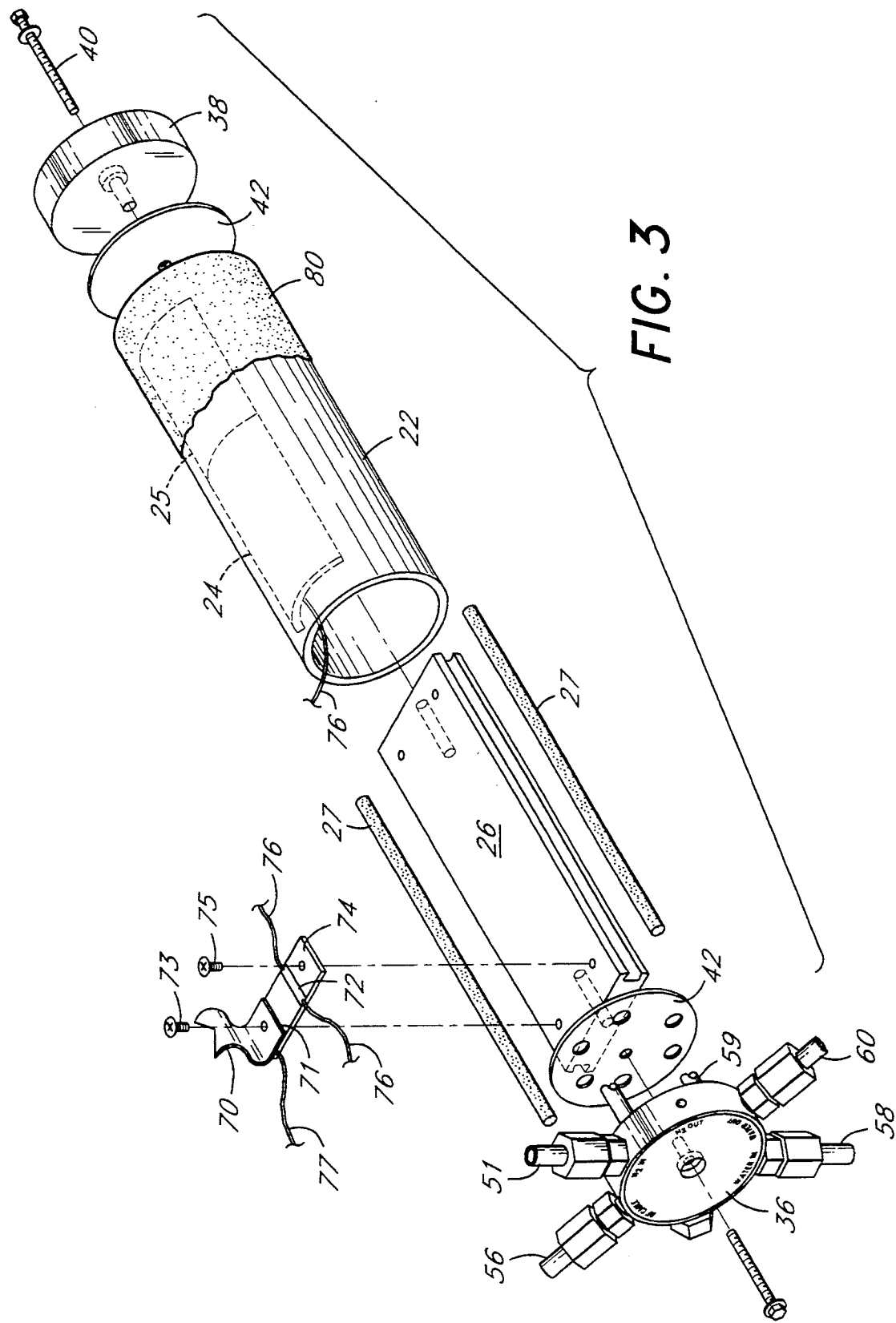
FIG. 3 is an exploded perspective view of the transducer assembly of FIG. 2.

In the lower portion of the tank 10, there is a transducer assembly 20 incorporating the primary unique aspects of the invention. Referring to FIGS. 2, 3 and 7, as well as FIG. 1, the transducer assembly may be seen to include a rigid heat conductive tube 22 with a pair of arcuate transducers 24 and 25 mounted to the interior upper surface of the tube. The transducers are coupled to the tube in a manner that will cause megasonic energy from the transducers to be transmitted through the tube 22 and hence into the cleaning solution 16. The transducers are preferably bonded to the tube by a suitable heat and electrically conductive epoxy so that the transducer and the transmitter will vibrate as a unit and heat generated by the transducers transferred to the tube 22. One suitable epoxy is sold in sheet form by Ablestick of Gardena, Calif. and identified as ECF 550.

Diametrically positioned within the tube is a flat partition 26 which extends throughout the length of the tube thereby dividing the tube into an upper transducer compartment 29 in which the transducers are bonded to the interior of the tube, and a lower cooling compartment 30. The partition 26 is curved on its axially extending edges so as to conform to the interior of the tube. Also, an axially extending groove 26a is formed in each edge of the partition, and preferably has a generally trapezoidal shaped cross section. An axially extending resilient seal 27 is positioned in each of the grooves to prevent fluid passage between the two compartments. The seal has a circular cross section with a diameter that requires that the seal be compressed into the groove 26 when the partition is installed in the tube, thereby providing a good seal, as best seen in FIG. 8. Also, a suitable lubricant may be applied to the seal to facilitate insertion of the partition into the tube. The seal is stretched slightly, when installed in the slot and the tube, so that it has a tendency to creep back and thereby increase its diameter and thus improve the seal with the tube. Further, the seal 27 may be made a little longer when installed, and then, after stabilizing, cut to the exact length of the partition 26 so that the seal is good at both ends.

The ends of the tubes are closed by end caps 36 and 38. Each cap is clamped to the end of the tube 22 by a fastener 40 extending axially through a central opening 39 in each of the end caps and threaded into a tapped hole 41 in the ends of the partition 26. A gasket 42 is clamped between each cap and an end of the tube and the end of the partition.

Fluid communication with each of the chambers is provided by passages in the end cap 36. As seen in FIG. 4 and 5 as well as FIGS. 1-3, the end cap 36 is provided with six elbow-shaped passages 45, 46, 47, 48, 49 and 50, including a radially extending portion and an axially extending portion that opens into the interior of the tube.

Tubing 51 connected to the passage 45 by suitable fittings 52 and 54 opens into the upper, transducer chamber for ducting nitrogen or some other suitable inert gas into the transducer chamber. Fitting 54 is threaded into the end cap 36, and fitting 52 is threaded into the fitting 54, clamping a flared end (not shown) of the tubing 51 between the fittings As seen from FIGS. 4 and 6, a conduit 53 is connected to the end of the passage 45 that opens into the transducer chamber. The conduit 53 extends axially, terminating close to but spaced from the end cap 38. With such an arrangement, nitrogen introduced through the tubing 51 flows through the passage 45 and the conduit 53 and is then returned through the length of the transducer chamber to exit through the passage 46 to the atmosphere, as indicated by the arrows 55a and 55b. The passage 46 need not have a radially extending tube connected to it.

An RF cable 56 extends radially into the passage 47 which opens to the interior of the transducer chamber.

The cable is sealingly secured to the end cap 36 by a suitable fitting 57 threaded onto a fitting 54. Suitable electrical conductors are provided by the RF cable for connection to the transducers, as discussed further below.

Coolant inlet tubing 58 is connected to the passage 48 by fittings 52 and 54, and a conduit 59 connected to the passage 48 conducts coolant to the other end of the tube and opens into the interior of the lower, coolant chamber 30. Coolant flows throughout the coolant chamber and exits the chamber by way of the cap passage 49. The radially directed end of the passage 49 is connected by fittings 52, 54 to outlet tubing 60 leading to a coolant drain, as indicated by the arrow 61b. The additional cap passage 50 is closed by a suitable plug 62, and is available for other connections if desired.

The inlets and outlets to the interior of the tube 22 may alternatively be arranged so that the fluids enter through one end cap but exit from the opposite one. Also, the passages 45–50 may extend axially through the caps without being elbow-shaped. Likewise, the fitting 54 could be elbow-shaped for axial passage through the caps, so as to minimize the length of the tank assembly.

Figure 6:
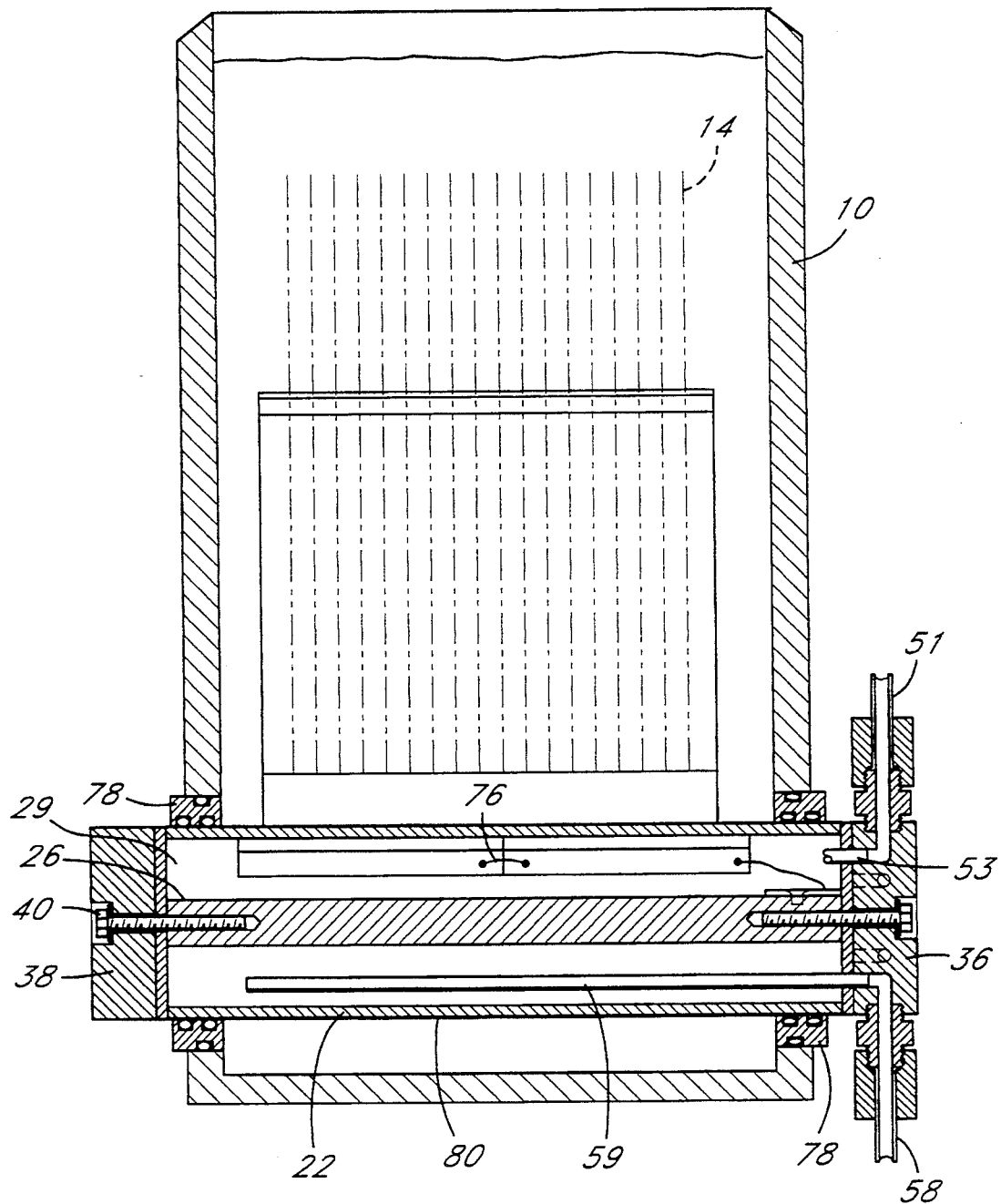
FIG. 6 is a cross-sectional view on line 6—6 of FIG. 1 further illustrating the apparatus of FIG. 1.
Figure 9:
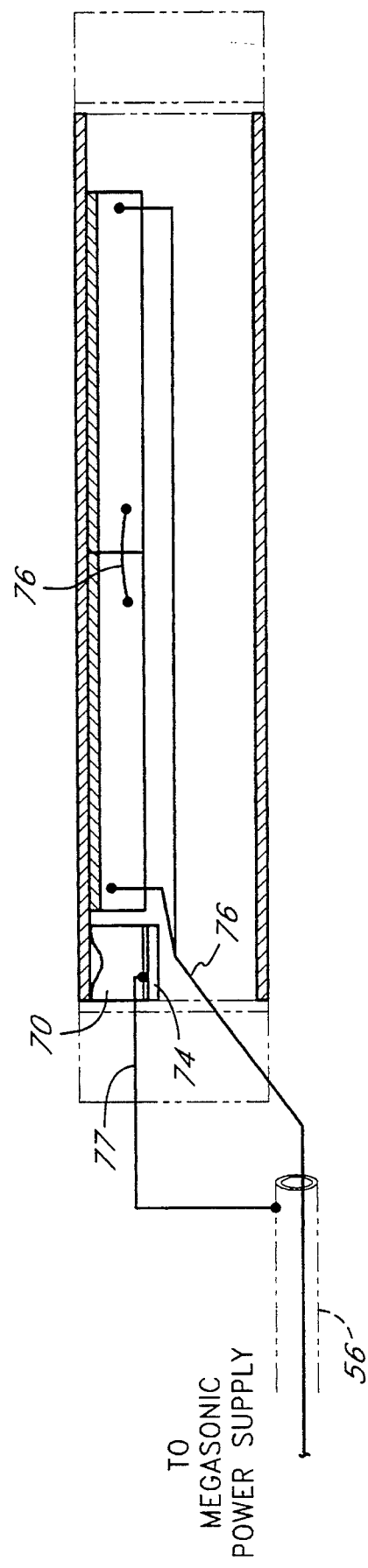
FIG. 9 is a cross-sectional, somewhat schematic view illustrating the electrical connections to the transducers.

Referring to FIGS. 3, 6 and 9, the RF cable 56 which carries the megasonic power include a pair of leads 76 and 77 connected to spaced conductive terminals 71 and 72 on a plate 74 made of insulating material. Ground wire 77 is connected to terminal 71. The plate 74 is secured to one end of the partition by a pair of screws. One conductive screw 73 passes through the terminal 71 on the plate 74 so that it grounds the terminal to the partition 26 which is electrically conductive. A conductive spring contact 70 connects the terminal 71 to the aluminum tube. The other screw 75 extends through the non-conductive plate 74 and into the partition 26. The conductive terminal 72 is connected by suitable leads 76 to the transducers. The terminal 72 for convenience is not shown in FIG. 9.

As seen from FIGS. 1 and 6, the transducer assembly 20 extends across the tank 10 with the tube extending through the tank walls, and the ends of the tube 22 and the tube end caps being positioned outside of the tank walls. A suitable sealing arrangement 78, schematically illustrated in FIG. 6, surrounds the tube ends where they pass through the tank walls. The actual seal employed will depend on tank materials and dimensions. The tube 22 has an exterior layer which does not react to solutions used for cleaning semiconductor wafers, including hydrofluoric acid. This layer, schematically seen in FIG. 3, is preferably in the form of a heat-shrinkable, seamless sheath 80 made of a suitable plastic material, such as polytetrafluoroethylene, such as that sold under the trade name FEP Teflon. Preferably, the wall of the sheath is very thin. Practically, a range of 0.005 to 0.025 inches is believed to be suitable, with somewhere in the middle of that range being most preferable. A thicker sheath may function, but not as well from the sonic transmission standpoint. A thinner sheath is desirable from the standpoint of transmitting energy, but it may not chemically protect the tube 22. Positioning the sheath on the tube and then shrinking it by heat causes the sheath to be held in tight confinement on the exterior of the tube. In addition, it is preferable that a layer of a suitable epoxy be positioned between the tube and a roughened or etched interior of the sheath to further bond the sheath to the tube so that the sheath and the tube will vibrate as a unit. Such an epoxy can also be purchased from EV Roberts of Culver City, Calif., utilizing a resin identified as RF-5000 and a hardener identified as RF-61.

The Teflon sheath with the etched interior may be purchased from Bunnell Plastics, Inc., I-295 and Harmony Road, Mickelton, N.J. 08056, identified as THFE-6-2500-20. Also, Bunnell will heat shrink and bond a sheath to an aluminum tube 22 utilizing its proprietary epoxy.

Operation

In use, wafers 14 are positioned in the solution 16 of the tank 10, as seen in FIG. 1. Nitrogen is delivered to the transducer chamber 29 (FIGS. 6 and 9) by way of the tubing inlet 51, the end cap passage 45, the conduit 53, and withdrawn from the chamber by way of the passage 46, as seen in FIG. 4. This maintains a slight pressure within the transducer chamber 29 and prevents flow of other vapors into the chamber. Further, in the event that undesired gases enter the chamber, the continuous flow of nitrogen helps duct such material away from the chamber.

Megasonic energy applied to the transducers by the RF cable causes them to propagate the energy through the tube 22 and its Teflon sheath 80 into the solution 16, across the faces of the wafers. This causes loosening of particles that may be trapped on the wafers. The megasonic energy is propagated by the transducer in a diverging pattern and is transmitted through the tube 22 in substantially the same pattern. With such an arrangement, substantially the entire flat sides of the wafers are subjected to the megasonic energy without moving the wafers or the transducer assembly, as in some prior arrangements. The solution 16 may be provided to the tank 10 on a batch basis wherein it is changed as needed, or it may be connected for a continuous or intermittent flow arrangement through connections not shown.

Applying high frequency energy to the transducers generates heat. Also, in some wafer treatment operations, it is desirable that the processing solutions be at elevated temperatures. Excess heat can be harmful to the transducers. To cool them, liquid coolant, such as water, is ducted through the coolant chamber 30 (FIG. 7) by way of the inlet tubing 58, the end cap passage 48, the conduit 59, the end cap outlet passage 49, and the outlet line 60. Because the tube 22 is made of a good heat conductive material, the temperature of the tube, and hence the transducers may be easily maintained within a predetermined maximum. It is only necessary to increase the flow of coolant as desired to control the temperature.

The tube 22 may be made of various material, such as aluminum, magnesium, beryllium, titanium, sapphire, or a heat conductive composite material incorporating carbon fibers bound together by a suitable binder such as an epoxy. Another possible material for the tube is graphite, sold by Poco Graphite, Inc. of Decatur, Tex., and identified as DFP-2 grade. Such material is sometimes used for wafer cassettes. The material is a good heat conductor and is less expensive than sapphire. The polytetrafluoroethylene sheath protects the metal from cleaning solutions such as hydrofluoric acid, and prevents contaminants from the tube entering the solutions. Aluminum is a preferred material since it is a good heat conductor, and thus the water cooling requirements can be kept quite low, much less than that required by a comparable transducer array employing a quartz tube with water being sprayed onto the transducers. The transducer assembly utilizing an aluminum tube can accommodate cleaning liquid temperatures of more than 100° C. Yet the temperature of the transducers has been kept below 80° with cooling water flow rates much less than that required for a comparable quartz unit with a lower cleaning solution temperature. There are temperature limitations on the polytetrafluoroethylene sheath and it cannot be readily cooled when it is in contact with hot cleaning solutions. Other suitable materials may have higher temperature limits.

Other desirable characteristics of aluminum are that it is relatively lightweight and inexpensive and readily machinable such that tolerances can be easily maintained. This is important for uniform mating of the interior of the tube 22 with the layer of epoxy and the exterior of the transducer.

With aluminum being relatively strong, the transducer assembly is not readily breakable and is not affected by temperature variations that occur during shipment of goods. Also, it will not crack and leak so that the transducer assembly with a metal tube can be utilized with flammable solvents.

Another advantage of the arrangement illustrated is that the transducer assembly can be operated in any position. While it is shown in the drawings in a horizontal position, in some applications it may be desirable to have a vertical orientation. This is in contrast to a quartz tube arrangement wherein it may be necessary to spray coolant on the transducers, but fully covering the transducers with coolant is not acceptable from an electrical standpoint. Further, if the electrical connections were encapsulated, covering the transducer with water, this would still not be acceptable because megasonic energy would be transmitted into the liquid.

With increased cooling capability, the power applied to the transducers can also be increased. This in turn increases the speed of cleaning, and hence improves efficiency. In a prototype unit, transducers having approximately 10 square inches of piezoelectric material were bonded to the interior of an aluminum alloy tube with an interior diameter of about 2 inches and a wall thickness of about 0.140 inches. RF energy with a frequency of 850 kilo Hertz with a power level of 35 watts per square inch was applied. The wall thickness was about half the RF energy wavelength to maximize vibrational efficiency and yet provide a tube of sufficient strength and thermal conductivity. The wall thickness of other half wavelength multiples may be employed consistent with the frequency. RF energy in a range of 400-2500 kilo Hertz or higher may be utilized.

Embodiments of FIGS. 10, 11 and 12

Another advantage of aluminum is that it can be readily extruded. Thus, instead of utilizing a separate partition wall with its need for seals on its edges engaging the interior wall of the tube, as shown in FIG. 7, the tube 122, shown in FIG. 10, may be extruded with its partition 126 integral with the surrounding tube. It is only necessary to tap holes in the ends of the partition for mounting end caps to the tube. The integral partition of course provides better heat transfer between the tube and the partition, and thus promotes improved cooling. In addition, the integral partition eliminates the time and expense of inserting the partition into the tube, as well as the need to accurately cut the length of the separate partition for adequate end sealing.

Extruding the tube also permits the use of additional walls in the tube. For example, in FIG. 11, a tube 222 having an additional partition wall 227 is illustrated such that the cooling chamber is divided into two compartments 230a and 230b. The additional partition wall increases the heat transfer capabilities of the tube 222 inasmuch as more surface is exposed to the coolant. Further, if desired, different coolants may be conducted through the different compartments. For example, chilled coolant might be used in one chamber and a less costly ambient temperature coolant in the other chamber. The flow rates can then be adjusted to maintain the temperature of the transducer array below an acceptable maximum.

Referring to FIG. 12, an extruded tube 322 is shown having a large number of fins 326 projecting radially towards the center of the tube to greatly increase the heat transfer surface. With that arrangement, possibly nitrogen or some other gaseous coolant could be employed throughout the remaining space in the tube. While such an arrangement would not have the cooling capacity of the liquid coolant system, it may be acceptable in certain applications. A partition dividing the tube into chambers can of course also be utilized with the fins.

Figure 13:
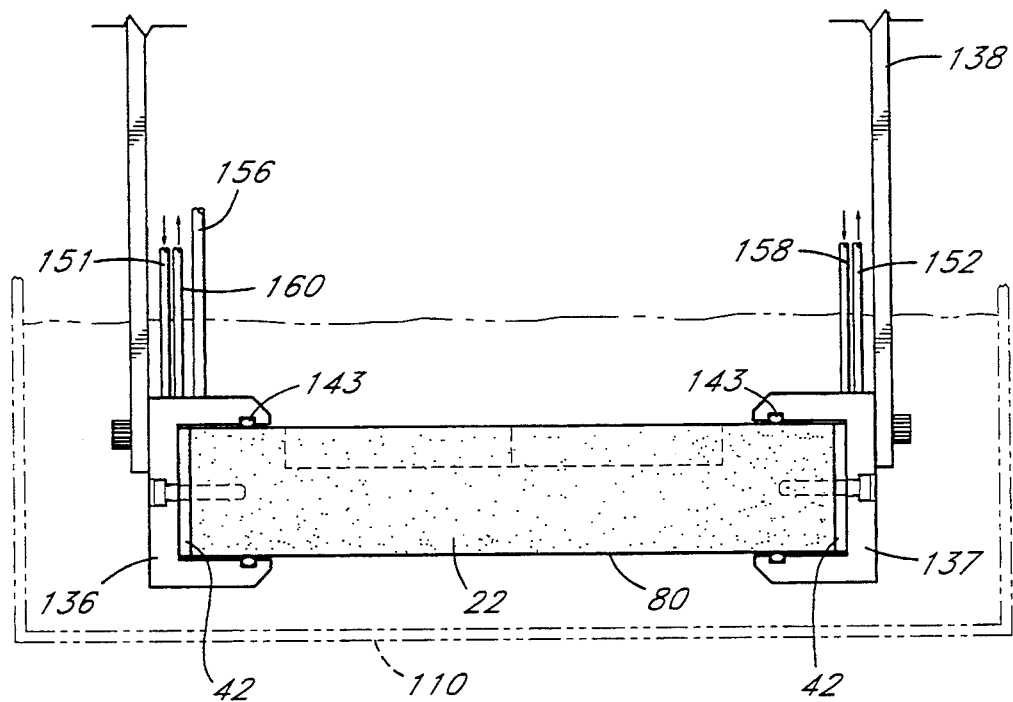
FIG. 13 is a schematic, perspective view of an immersible form of the transducer assembly of the invention.

Embodiment of FIG. 13

Another advantage of the transducer assembly of the invention is that it may be provided with end cap connections that make it totally immersible. Such an arrangement avoids the need to provide seals between the tank and the transducer tube 22. It also enables the transducer assembly to be used in various tanks rather than being affixed to a particular one. FIG. 13 schematically illustrates such an arrangement wherein end caps 136 and 137 are formed with a cup shape that fits over the end of the transducer tube 22. An O-ring 143 is positioned between the internal side walls of the end caps and the exterior of the tube to prevent solution from reaching the ends of the tube. The O-ring should, of course, be selected from materials which are compatible with the cleaning solutions.

The end caps 136 and 137 are shown schematically provided with the necessary tubing 151 and 152 for ducting nitrogen, and tubing 158 and 160 for ducting coolant through the tube 22, and cable 156 for providing RF power. As noted above, the end cap connection may be through elbow passages in the end caps or through straight axial passages, and the passages may all be in one end cap and used with conduits within the tube 22 or may be in both ends, as shown, without the need for internal conduits. Likewise, the external connections to the end cap passages may be elbowed or straight to best fit the tank space constraints. A handle 138 may be attached to each of the end caps to facilitate insertion, removal and support of the transducer assembly in a cleaning tank. If convenient, the fluid connections to the end caps may be ducted through the handle.

Figure 14:
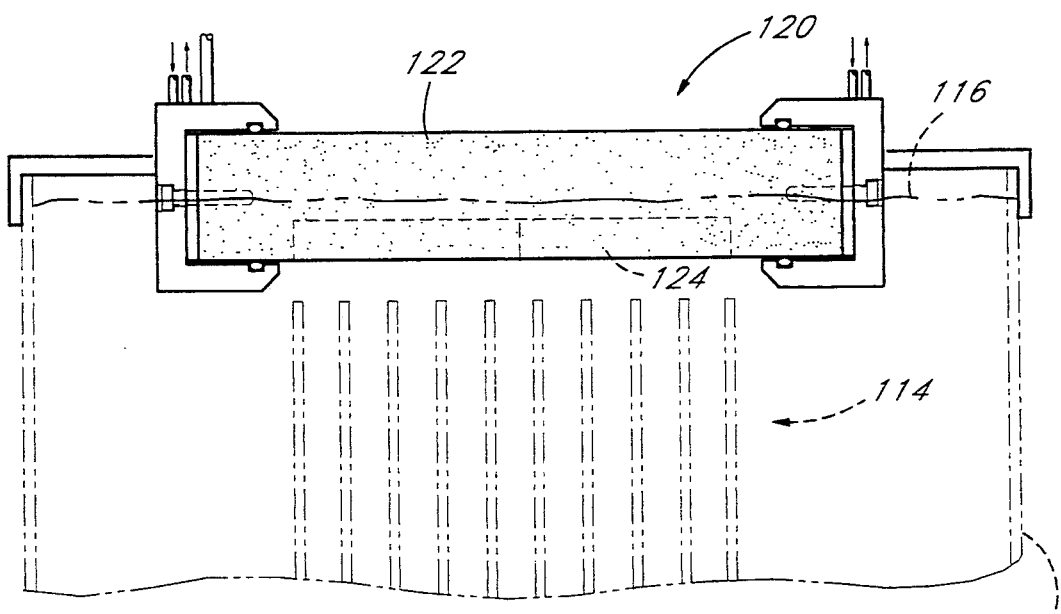
FIG. 14 schematically shows a form of the invention wherein the transducer array is positioned above the wafers.

Embodiment of FIG. 14

As mentioned above, one of the advantages of the transducer assembly of the invention is that it can be utilized in any orientation. FIG. 14 schematically illustrates an arrangement wherein the transducer assembly 120 similar to that of FIG. 13 is positioned above a group of wafers 114 positioned in a tank 110 containing cleaning solution 116. The assembly is shown positioned horizontally, however, with the transducers 124 facing downwardly towards the wafers, rather than upwardly. The portion of the tube 122 containing the transducers is immersed in the liquid 116, but the portion of the tube containing the cooling chamber need not be positioned in the liquid. The megasonic energy is directed downwardly across the faces of the wafers.

There are several advantages to such an arrangement. One is that there are many tanks currently in use that are not deep enough to allow the transducer assembly to be positioned beneath a cassette of wafers. Further, in most instances, the tank needs to be specifically designed to have the wafers supported in the tank in a fashion that permits the transducer assembly to be positioned beneath the wafers. Thus, the arrangement can be quite useful in those situations. Also, the efficiency of the cooling may be slightly increased due to the fact that the coolant portion of the chamber is not exposed to the cleaning solution, which is usually at a higher temperature than the coolant. Nevertheless, the conductivity of the tube is adequate to maintain the transducer assembly at an acceptable temperature level. In order to insert and remove the wafers, a suitable support system (not shown) may be provided for conveniently moving the transducer assembly into and out of operative position.

What is claimed is:

1. Apparatus for cleaning semiconductor wafers, including a transducer assembly for applying megasonic energy into fluid surrounding the wafers, said assembly comprising:
    a rigid tube made of metal or other material that is strong, a good thermal conductor and a good transmitter of megasonic energy;
    a partition in the interior of said tube extending substantially throughout the length of the tube to form a transducer chamber and a coolant chamber in combination with said tube, said partition having edges that are formed integral with the tube or are sealed with respect to the tube so as to prevent communication between said chambers;
    one or more arcuate transducers in said chambers coupled to an adjacent side wall of the tube to direct energy through the side wall when megasonic energy is applied to the transducers;
    a cap on each end of the tube; and
    passages in communication with the interior of said tube to conduct an inert gas through the transducer chamber, and to conduct liquid coolant through the coolant chamber to cool said assembly.

2. The apparatus of claim 1, including a layer of material on the exterior of said tube to separate the tube and fluid in said tank.

3. The apparatus of claim 2, wherein said layer of material is a sheath which tightly surrounds the tube.

4. The apparatus of claim 3, including material extending between the sheath and the tube to bond the sheath to the tube.

5. The apparatus of claim 3, wherein said sheath is heat-shrunk on said tube.

6. The apparatus of claim 5, wherein said sheath is made of polytetrafluoroethylene material.

7. The apparatus of claim 6, wherein the wall thickness of said sheath is in the range of 0.05 to 0.025 inches.

8. The apparatus of claim 7, wherein said tube is made of aluminum and has a wall thickness of approximately 0.140 inches.

9. The apparatus of claim 2, including a container having a pair of spaced side walls, and wherein said transducer assembly extends across said container with ends of said tube extending through said side walls in sealed relation with the side walls, said layer covering the portion of said tube exposed to the interior of the container.

10. The apparatus of claim 1, wherein said tube is made of aluminum and has a wall thickness approximately equal to one-half the wavelength of the megasonic energy applied to said transducers.

11. The apparatus of claim 1, wherein said passages are in said end caps.

12. The apparatus of claim 1, wherein said passages are in one of said end caps, and including a conduit in each of said chambers respectively connected to one of said passages to conduct fluid from one end of the tube to the opposite end of the tube.

13. The apparatus of claim 1, wherein said tube is made of aluminum, magnesium, beryllium, titanium, graphite, or a composite material made of fibers and a suitable binder.

14. The apparatus of claim 1, including a container for said wafers and said fluid, said transducer assembly being positioned above said wafers with the side of said tube coupled to said transducer facing the interior of the container so that when that side of the tube is immersed in fluid, megasonic energy may be directed downwardly through the fluid and adjacent the wafers.

15. Apparatus for cleaning semiconductor wafers including a transducer assembly for applying megasonic energy into fluid surrounding the wafers, said assembly comprising:
    a rigid tube made of material that is strong, a good thermal conductor and a good transmitter of megasonic energy, but said material is not compatible with hydrofluoric acid;
    one or more transducers in said tube coupled to an interior side wall of the tube to direct megasonic energy through the wall when the transducer is energized;
    a liquid coolant chamber in said tube with inlet and outlet liquid passages communicating with the coolant chamber, a transducer chamber in the tube isolating the transducers from the liquid coolant chamber, and inlet and outlet passages communicating with the transducer chamber to permit gas to flow through the transducer chamber; and
    a layer of material on the exterior of said tube to shield the tube from fluid in the tank, said layer of material being sufficiently thin to not significantly affect the transmission of megasonic energy through said tube.

16. The apparatus of claim 15, wherein said layer of material is in the form of a tubular sheath which tightly surrounds the tube.

17. Apparatus for cleaning semiconductor wafers including a transducer assembly for applying megasonic energy into fluid surrounding the wafers, said assembly comprising:
    a rigid tube made of material that is strong, a good thermal conductor and a good transmitter of megasonic energy, but said material is not compatible with hydrofluoric acid;
    one or more transducers in said tube coupled to an interior side wall of the tube to direct megasonic energy through the wall when the transducer is energized;
    means for conducting a coolant through said tube in good heat transfer relation with the tube to cool the tube and thereby maintain the temperature of the transducer below a predetermined maximum; and a sheath of heat shrinkable polytetrafluoroethylene material which is heat shrunk unto the exterior of the tube, said sheath being sufficiently thin to not significantly affect the transmission of megasonic energy through said tube.

18. The apparatus of claim 17, including a layer of epoxy extending between said sheath and said tube to further tightly bond the sheath to the tube.

19. The apparatus of claim 15, wherein said tube is made of aluminum, magnesium, beryllium, titanium, graphite, or a composite material made of fibers and a suitable binder.

20. A method of making a transducer assembly for positioning in a tank containing a cleaning fluid and one or more semiconductor wafers, said assembly being adapted to propagate megasonic energy into the fluid, said method comprising:

supplying a rigid tube made of metal or other material that is strong, a good thermal conductor, and a good transmitter of megasonic energy;

positioning a partition in the interior of said tube that extends substantially throughout the length of the tube to form a transducer chamber and a coolant chamber in combination with said tube;

forming edges of said partition integral with said tube or sealing the ends of the partition with said tube so that said chambers are sealed from each other;

coupling one or more transducers to an interior side wall of the tube to direct megasonic energy through the side wall when the transducers are energized;

closing the ends of said tube; and providing passages in communication with the tube interior for conducting an inert gas through the transducer chamber, and for conducting liquid coolant through the coolant chamber to cool said transducers.

21. A method of making a transducer assembly for use in the cleaning of semiconductor wafers, comprising:

providing a thin wall rigid tube made of metal or other material that is strong, a good thermal conductor and a good transmitter of megasonic energy;

coupling one or more transducers to an interior wall of said tube to direct megasonic energy through the wall and into the tank when the transducer is energized;

providing a layer of material on the exterior of said tube which is compatible with wafer cleaning solutions including hydrofluoric acid;

providing passages to the interior of said tube for conducting coolant through said tube to maintain the temperature of said assembly below a predetermined maximum; and providing a chamber within the tube around the transducers that isolates the transducers from the coolant passages, with the chamber having an inlet and an outlet through which gas may be conducted.

22. A method of making a transducer assembly for use in the cleaning of semiconductor wafers, comprising:

providing a thin wall rigid tube made of metal or other material that is strong, a good thermal conductor and a good transmitter of megasonic energy;

coupling one or more transducers to an interior wall of said tube to direct megasonic energy through the wall and into the tank when the transducer is energized;

providing a layer of material on the exterior of said tube which is compatible with wafer cleaning solutions including hydrofluoric acid;

providing passages to the interior of said tube for conducting coolant through said tube to maintain the temperature of said assembly below a predetermined maximum; and the step of providing said layer of material includes heat shrinking a thin sheet of polytetrafluoroethylene or similar material onto the exterior of said tube.

23. The method of claim 22, including applying a layer of epoxy between said sheath and said tube to bond the sheath to said tube.

* * * * *